(12) United States Patent
Mashino

(10) Patent No.: US 6,815,348 B2
(45) Date of Patent: Nov. 9, 2004

(54) METHOD OF PLUGGING THROUGH-HOLES IN SILICON SUBSTRATE

(75) Inventor: Naohiro Mashino, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/459,609

(22) Filed: Jun. 12, 2003

(65) Prior Publication Data

US 2003/0235982 A1 Dec. 25, 2003

(30) Foreign Application Priority Data

Jun. 19, 2002 (JP) ........................................ 2002-178902

(51) Int. Cl.[7] .............................................. H01L 21/44
(52) U.S. Cl. ...................................... 438/672; 692/959
(58) Field of Search ................................ 438/672, 674, 438/675, 678, 692, 734, 959

(56) References Cited

U.S. PATENT DOCUMENTS 4,348,253 A  9/1982 Subbarao et al.
6,114,098 A * 9/2000 Appelt et al. ................ 430/315
6,399,486 B1 6/2002 Chen et al.

FOREIGN PATENT DOCUMENTS

JP     1-258457     10/1989

OTHER PUBLICATIONS

Fujikawa, T., et al., "New Copper Interconnect Technology Using High Pressure Anneal Process", Conference Proceedings of Advanced Metallization Conference 1999, Sep. 28–30, 1999.

* cited by examiner

Primary Examiner—Phuc T. Dang
(74) Attorney, Agent, or Firm—Staas & Halsey LLP

(57) ABSTRACT

The through-holes 2 in the silicon substrate 1 are plugged with the metal 8 by means of electrolytic plating. After both faces of the silicon substrate are polished and smoothed, high pressure annealing is conducted on the silicon substrate so as to remove minute voids generated in the plugged metal and, therefore, the preciseness and density of the plugged metal is enhanced.

7 Claims, 3 Drawing Sheets

PLUGGING

DRILLING

PLUGGING

POLISHING

ANNEALING

METHOD OF PLUGGING THROUGH-HOLES IN SILICON SUBSTRATE

BACKGROUND OF THE INVENTION

1. Field of the Invention

The present invention relates to a method of filling or plugging metal in through-holes formed in a single-crystals silicon substrate used for a silicon semiconductor device, an interposer and so forth.

In the case of three-dimensionally mounting components on a silicon substrate, the most difficult matter is to electrically connect the circuit wiring formed on the upper surface with the circuit wiring formed on the lower surface of the silicon substrate.

2. Description of the Related Art

Conventionally, electrical continuity is accomplished between the upper and the lower surfaces of a silicon substrate as follows. After through-holes are formed in the silicon substrate, penetrating the upper and the lower surfaces, metal is plugged into the through-holes, and circuit patterns on the upper and the lower surfaces of the silicon substrate are connected with each other by the metal conductor plugged in the through-holes.

For example, Japanese Unexamined Patent Publication No. 1-258457 discloses a method of manufacturing a semiconductor integrated circuit in which through-holes are formed in a silicon mounting substrate made of a single crystal of silicon and the single-crystal silicon substrate is coated with an insulating film by means of thermal oxidation and the through-holes are plugged with metal. In the official gazette of the patent publication, there is disclosed a technique in which an electrode for plating is attached to the main surface of the silicon mounting substrate and the through-holes are plugged with metal by means of plating.

According to the above conventional methods of plugging the through-holes in the silicon substrate, there is a problem in which minute voids are generated in the metal plugged into the through-holes by means of plating. Therefore, it is impossible to plug the through-holes with metal precisely and densely. In order to prevent the generation of the above minute voids, investigations have been made into a method in which, after the through-holes were plugged with metal by means of plating, the reverse surface of the silicon substrate is ground so as to expose the plugged metal. However, even when the above countermeasure was taken, it was impossible to prevent the generation of minute voids in the plugged metal. Therefore, it was found impossible to obtain plugs consisting of sufficiently precise and dense metal. Accordingly, in the method of prior art, the reliability of the via wiring on the semiconductor wafer was low, and the yield was deteriorated.

SUMMARY OF THE INVENTION

It is, accordingly, an object of the present invention to provide a method of plugging through-holes in a silicon substrate with metal in the case where, after the through-holes are formed on the silicon substrate and these through-holes are plugged with metal by means of plating, the method being characterized in that the generation of minute voids in the plugged metal is prevented so that the through-holes can be plugged with precise and dense metal.

According to the present invention, there is provided a method of plugging through-holes in a silicon substrate comprising the following steps of: providing the silicon substrate having first and second surfaces with through-holes penetrating from the first surface to the second surface; forming the first and second surfaces of the silicon substrate including inner wall faces of the through-holes with an insulating film; adhering a conductor plane to the second surface of the silicon substrate by means of an adhesive; etching the adhesive via the through-holes from the first surface of the silicon substrate to drill the adhesive so that the conductor plane is exposed in inside of the through-holes; filling the through-holes with a metal by plating the metal using the conductor plane as an electrode from the first surface of the silicon substrate; peeling off the conductor plane and smoothing the first and second surfaces of the silicon substrate including the filled metal; and conducting a high-pressure annealing on the silicon substrate.

It is advantageous that the insulating film formed on the first and second surfaces of the silicon substrate including the inner wall faces of the through-holes is an oxide film ($SiO_2$ film) formed by means of chemical vapor-deposition (CVD) or thermal treatment.

It is also advantageous that the etching step of the adhesive film is conducted by plasma etching. The smoothing step of the first and second surfaces of the silicon substrate is conducted by chemical mechanical polishing (CMP).

The step of high-pressure annealing on the silicon substrate is conducted under a pressure of 150 MPa at a temperature of 350° C. in the atmosphere of argon. Also, the adhesive is preferably an adhesive film. The metallic plane is preferably a copper foil.

DETAILED DESCRIPTION OF THE PREFERRED EMBODIMENTS

Referring to the accompanying drawings, an embodiment of the present invention will be explained in detail as follows.

Figure 1:
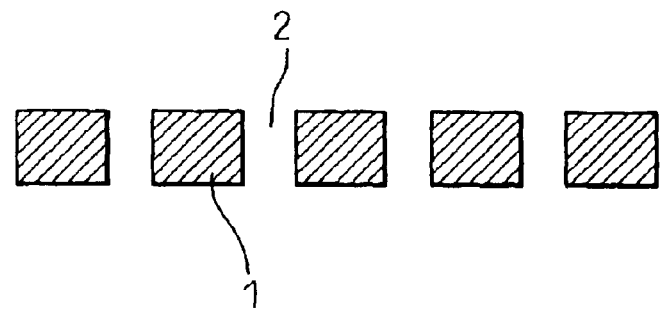
FIG. 1 is a view showing a step in which through-holes are formed on a silicon substrate of single crystals.

FIG. 1 is a view showing a step in which the through-holes 2 are formed in the single-crystal silicon substrate 1. In this case, the silicon substrate 1 may be either a silicon substrate used as a wafer for an electronic device, such as semiconductor elements, or a silicon substrate used as a wafer for an interposer. The silicon substrate 1 may be either a thick silicon substrate of several 100 μm in thickness or a thin silicon substrate of several tens of μm in thickness. The through-holes 2 can be formed by means of a known method, such as mechanical drilling or laser beam machining or by a chemical method such as etching.

Figure 2:
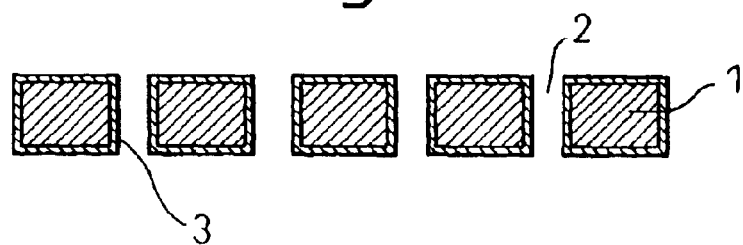
FIG. 2 is a view showing a step in which an insulating film is entirely formed on the front and the reverse surfaces of a silicon substrate including the inner wall faces of through-holes.

FIG. 2 is a view showing a step in which an insulating film 3 is formed on the entire surfaces of the front and the reverse surfaces (first and second surfaces) of the silicon substrate 1 including the inner wall faces of the through-holes 2. This insulating film 3 can be formed as a thermal oxidation film (film of $SiO_2$) formed by means of chemical vapor-deposition (CVD) or a thermal oxidation film (film of $SiO_2$) formed when a surface of the silicon substrate is oxidized by heat treatment in the atmosphere.

Figure 3:
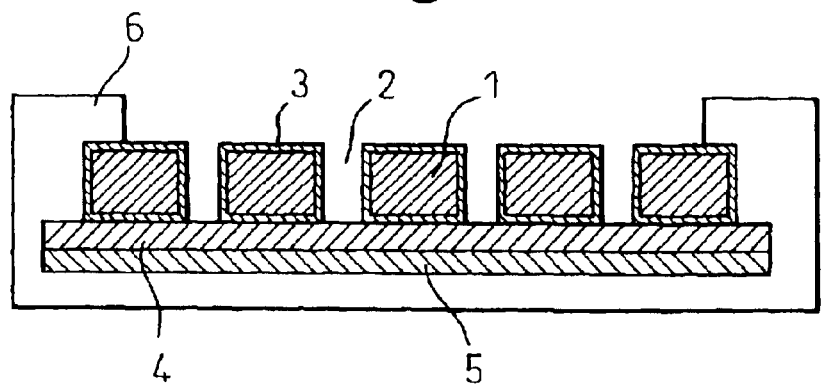
FIG. 3 is a view showing a step in which a piece of metallic foil or a metallic plate is made to adhere to the reverse surface of a silicon substrate by an adhesive film.

FIG. 3 is a view showing a step in which a piece of metallic foil or a metallic sheet 5 is made to adhere to the reverse surface of the silicon substrate 1 by an adhesive resin film 4. The piece of metallic foil 5 is made of metallic material such as copper foil, which is used as a cathode in the case of conducting electrolytic plating in the later step. The silicon substrate 1, adhesive film 4 and metallic foil 5 are fixed to each other by a jig 6.

Figure 4:
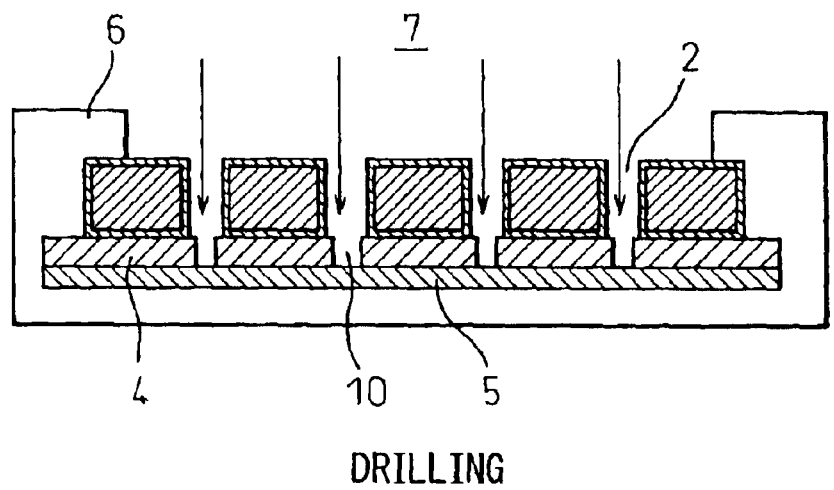
FIG. 4 is a view showing a state in which drilling is conducted on an adhesive film.

FIG. 4 is a view showing a state in which, while the silicon substrate 1, the adhesive film 4 and the metallic foil 5 are fixed to each other by the jig 6, etching is conducted toward the through-holes 2 from an upper surface of the silicon substrate 1 so that drilling can be conducted to the adhesive film 4 at portions corresponding to the through-holes 2. In this case, it is preferable that etching is conducted by means of plasma etching by which plasma is irradiated into the through-holes 2. When the holes 10 are formed in the adhesive film 4 in this way, portions of the piece of metallic foil 5 corresponding to the through-holes 2 are exposed through the through-holes 2. Therefore, when electrolytic plating is to be conducted in the next step, this piece of metallic foil 5 can be utilized as a cathode.

Figure 5:
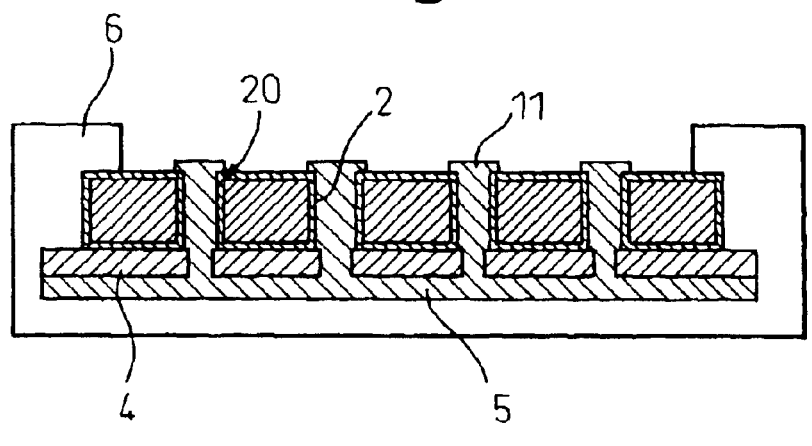
FIG. 5 is a view showing a step in which metal is plugged into through-holes by means of electrolytic plating.

FIG. 5 is a view showing a step in which the jig 6 is dipped in a plating solution and electrolytic plating is conducted while the piece of metallic foil 5 is used as a cathode as mentioned above and the metal 11 is precipitated in the through-holes so that these through-holes are plugged with the metal. In this case, it is preferable that the plating metal 11 is copper, the conductivity of which is high. As described above, when the piece of metallic foil or the metallic sheet 5 is made to adhere to the reverse surface of the silicon substrate 1 so that the piece of metallic foil or the metallic sheet 5 can be used as a cathode and further when the cathode is exposed in portions corresponding to the through-holes 2 on the silicon substrate 1, it is possible to precipitate the metal 11 only in the portions corresponding to the through-holes 2.

Figure 6:
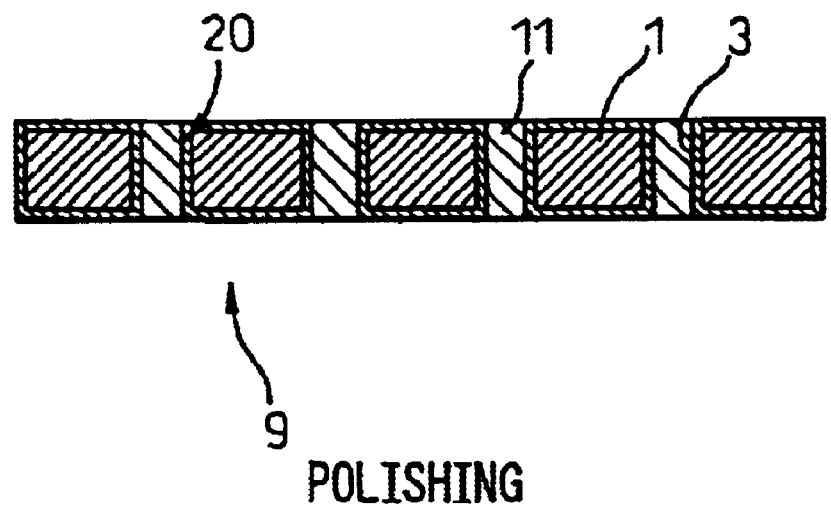
FIG. 6 is a view showing a step in which the respective surfaces of the silicon substrate are smoothed.

FIG. 6 is a view showing a step in which the piece of metallic foil 5, which has been made to adhere to the reverse side of the silicon substrate 1, is peeled off and both surfaces of the silicon substrate including the metal 11 plugged in the through-holes 2 are smoothed. Due to the foregoing, the silicon substrate becomes to have a shape 9 like a strip. In this step of smoothing both faces of the silicon substrate 1, it is preferable to adopt chemical mechanical polishing (CMP).

Figure 7:
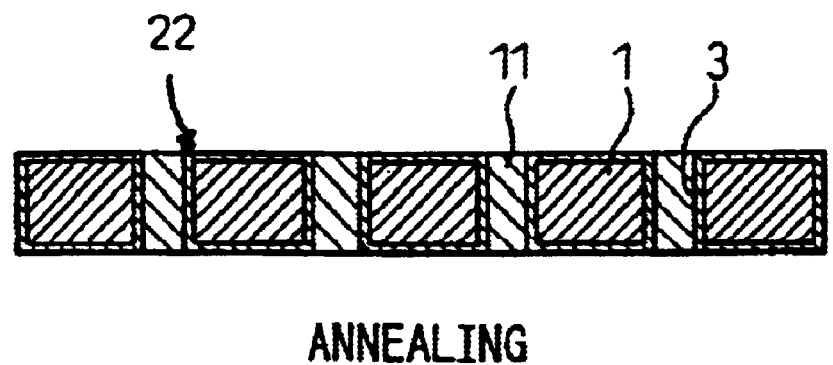
FIG. 7 is a view showing a step in which high pressure annealing is conducted on a silicon substrate.

FIG. 7 is a view showing a step in which high pressure annealing is conducted on the silicon substrate 1. In the step in which high pressure annealing is conducted on the silicon substrate 1, heat treatment is conducted in an atmosphere of high-pressure argon gas. In the process of annealing, it is appropriate that the heating temperature is set at about 350° C. and the pressure is set at about 150 Mpa. The heating temperature must be a value sufficiently lower than the melting points of copper and aluminum so that, of course, the plugged metal (for example, copper) and the aluminum wiring (not shown) on the silicon substrate 1 cannot be melted. The processing time must be a period of time in which the plugged copper can be made precise and dense.

As described above, according to the present invention, after the through-holes 2 have been plugged with metal (copper) by means of electrolytic plating, high pressure annealing is conducted. Due to the foregoing, the problems of minute voids formed in the plugged metal can be solved. Therefore, the plugs can be composed of precise and dense metal. For example, in the state shown in FIG. 6 before annealing, a minute gap 20 caused by minute voids exist between the plated metal 1 and the oxidized insulating film 3 on the inner wall of the through-hole 2, however, after the completion of high pressure annealing, this gap is filled with metal 22 as shown in FIG. 7. Due to the foregoing, the reliability of the via wiring can be enhanced, and deterioration of the yield can be effectively prevented.

When high pressure annealing is conducted, minute voids remaining in the plugs can be removed from the plugged metal, which has been filled in the through-holes, by synergism of the action of high pressure gas and the action of high temperature. Therefore, it can be considered that the metal can be densely and tightly filled in the through-holes.

Referring to the accompanying drawings, the embodiment of the present invention has been described above. However, it should be noted that the present invention is not limited to the above-mentioned specific embodiment. Variations, modifications and corrections may be made by one skilled in that art without departing from the spirit and scope of the invention.

As described above, according to the present invention, after the through-holes have been plugged with metal (copper) by means of electrolytic plating, high-pressure annealing is conducted. Due to the foregoing, the problems of minute voids formed in the plugged metal can be solved. Therefore, the plugs can be composed of precise and dense metal.

Due to the foregoing, the reliability of the via wiring can be enhanced, and deterioration of the yield can be effectively prevented. Therefore, on the silicon substrate used for chip level three-dimensional mounting, the through-holes can be plugged with copper by means of plating. When the chip level three-dimensional mounting is realized, it becomes possible to manufacture a high-performance semiconductor chip. Further, operation can be performed at high speed, and furthermore, compact mounting can be performed.

What is claimed is:

1. A method of plugging through-holes in a silicon substrate comprising the following steps of:

providing the silicon substrate having first and second surfaces with through-holes penetrating from the first surface to the second surface;

forming an insulating film on the first and second surfaces of the silicon substrate including inner wall faces of the through-holes;

adhering a conductor plane to the second surface of the silicon substrate by means of an adhesive;

etching the adhesive via the through-holes from the first surface of the silicon substrate to drill the adhesive and form corresponding holes therein so that the conductor plane is exposed through the holes in the adhesive and the corresponding through-holes in the silicon substrate;

filling the through-holes with a metal by plating the metal using the conductor plane as an electrode from the first surface of the silicon substrate;

peeling off the conductor plane and smoothing the first and second surfaces of the silicon substrate including the filled metal; and conducting a high-pressure annealing on the silicon substrate.

2. A plugging method as set forth in claim 1, wherein the insulating film formed on the first and second surfaces of the silicon substrate including the inner wall faces of the through-holes is an oxide film formed by means of chemical vapor-deposition or thermal treatment.

3. A plugging method as set forth in claim 1, wherein the etching step of the adhesive film is conducted by a plasma etching.

4. A plugging method as set forth in claim 1, wherein a smoothing step of the first and second surfaces of the silicon substrate is conducted by chemical mechanical polishing.

5. A plugging method as set forth in claim 1, wherein the step of high-pressure annealing on the silicon substrate is conducted under a pressure of 150 Mpa at a temperature of 350° C. in an argon atmosphere.

6. A plugging method as set forth in claim 1, wherein the adhesive is an adhesive film.

7. A plugging method as set forth in claim 1, wherein the metallic plane is a copper foil.

* * * * *